United States Patent [19]

Tanaka et al.

[11] Patent Number: 5,291,054
[45] Date of Patent: Mar. 1, 1994

[54] LIGHT RECEIVING MODULE FOR CONVERTING LIGHT SIGNAL TO ELECTRIC SIGNAL

[75] Inventors: Masao Tanaka; Kentaro Tanaka; Kunihiko Hakata; Susumu Nishimura; Mikihito Yamane; Susumu Maeta, all of Tottori, Japan

[73] Assignees: Sanyo Electric Co., Ltd., Osaka; Tottori Sanyo Electric Co., Ltd., Tottori, both of Japan

[21] Appl. No.: 902,625

[22] Filed: Jun. 23, 1992

[30] Foreign Application Priority Data

Jun. 24, 1991 [JP] Japan ................ 3-47667[U]
Mar. 6, 1992 [JP] Japan ................... 4-49656
May 11, 1992 [JP] Japan .................. 4-117430

[51] Int. Cl.⁵ .............. H01L 27/14; H01L 31/00
[52] U.S. Cl. ........................ 257/433; 257/432; 257/435; 257/458
[58] Field of Search ........... 257/431, 432, 433, 435, 257/458, 459, 81

[56] References Cited

U.S. PATENT DOCUMENTS 4,482,804 11/1984 Oritsuki et al. ............... 257/458
4,745,446 5/1988 Cheng et al. ................. 257/458
5,097,120 3/1992 Kitamura et al. ............. 257/458

FOREIGN PATENT DOCUMENTS

57-193075 11/1982 Japan ........................ 257/435
58-173255 11/1983 Japan .
58-196059 11/1983 Japan ........................ 257/433
59-90965 5/1984 Japan ......................... 257/81
60-5160 1/1985 Japan .
62-241383 10/1987 Japan .
63-138595 9/1988 Japan .

Primary Examiner—Rolf Hille
Assistant Examiner—Minhloan Tran
Attorney, Agent, or Firm—Nikaido, Marmelstein, Murray & Oram

[57] ABSTRACT

A light receiving device and a circuit device which includes an amplifier directly connected to the light receiving device are provided on a frame which is connected to a power source potential. The light receiving device and circuit device are integrally covered with resin. On electrodes through which the light receiving device and circuit device are connected to the frame, semiconductor substrates of the same conductivity type are provided, respectively.

10 Claims, 8 Drawing Sheets

LIGHT RECEIVING MODULE FOR CONVERTING LIGHT SIGNAL TO ELECTRIC SIGNAL

BACKGROUND OF THE INVENTION

1. Field of the Invention

The present invention relates to a light receiving module for use in a light remote control system utilizing light as a signal transmitting medium.

2. Description of the Prior Art

In recent years, a light remote control system utilizing light such as infrared rays as a signal transmitting medium has been used for many indoor apparatuses such as audio apparatuses, air-conditioners and television receivers, since infrared rays are tolerable to noises and capable of transmitting a comparatively large amount of information for a short period of time. In the light remote control system, a light emitting diode is used on the light irradiating side, and a light receiving module is used on the light receiving side. In a light receiving module disclosed in Japanese laid-open Utility Model Application No. H1-102834, a light receiving device and a circuit device for amplifying an output signal of the light receiving device are provided on a printed circuit board and housed in a shielding case.

In the above-mentioned light receiving module, however, an electrical connection arrangement is complicated since the light receiving device and the circuit device are connected through the printed circuit board. Further, since the connection line is long, noises are apt to be picked up between the light receiving device and the circuit device. Moreover, since a printed circuit board is used, the space occupied by the light receiving module is large. To solve these problems, it has been tried to integrate a light receiving device and a circuit device on one semiconductor substrate. However, it has not yet been put into practical use. This is because with such an arrangement, an output and a response speed of the light receiving device are low and because the circuit device is apt to erroneously operate when light is irradiated thereto.

Figure 1:
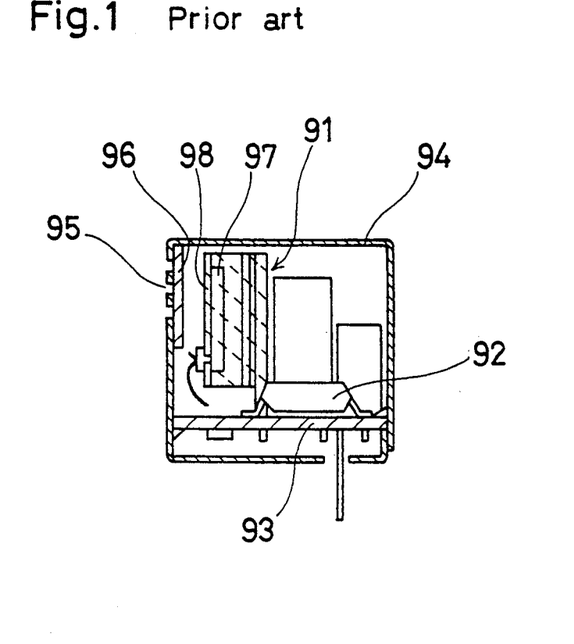
FIG. 1 is a cross-sectional view of a conventional light receiving module.

FIG. 1 shows a light receiving module disclosed in Japanese laid-open Patent Application No. H3-72730. In the figure, a light receiving device 91 and a circuit device 92 are provided on a printed circuit board 93, and are housed in a shielding case 94. A structure for removing noise signals is added to the light receiving module. That is, a mesh 95 is provided at a light input portion of the shielding case 94, and a light filter 96 is arranged inside the mesh 95. Thereby, a specific noise signal is attenuated. For example, when the light receiving module is used for a television receiver, the mesh 95 and the light filter 96 are designed so that a noise signal (the frequency thereof is in the vicinity of 16.6 KHz) from a flyback transformer is attenuated.

However, such a noise removing structure increases the number of required parts and complicates the arrangement of the light receiving device. Further, even a desired input light signal passing through the mesh 95 and the light filter 96 is attenuated by the noise removing structure. Furthermore, an overflowing current is apt to flow between a diffusion layer 97 and an insulating layer 98 in the light receiving device 91. Thereby, a predetermined output current cannot be obtained.

Moreover, an arrangement where a light signal is directed to a light receiving device through a transmission hole provided to the mesh 95 of a shielding case which covers the light receiving device has a predetermined directional characteristic with respect to an entering direction of the light signal.

That is, concerning a small-size television receiver, since a user is located in a direction toward which a display tube thereof faces, it is only necessary to receive a light signal coming from a range approximately 30 degrees on both sides of the direction toward which the center of the display tube faces. Since only light having passed through the transmission hole which is provided on a flat portion of the shielding case is received, it is sufficient to receive only light coming from the inside of a cone, which is a directivity range, formed by rotating a line which is at 40 degrees to the perpendicular with respect to the flat portion of the shielding case about the perpendicular.

Since apparatuses are becoming larger in size and there are more occasions where an apparatus is remote-controlled which is arranged in the vicinity of the ceiling such as a lighting apparatus, it is required to increase the angle of directivity. That is, concerning a 29- to 40-inch television receiver, it is required to enable the television receiver to be remote-controlled at any position in a wide range in a room so that a user can enjoy watching television anywhere in the room. Moreover, in a case where a lighting apparatus hung from the ceiling is controlled with a remote controller, it is required that a user having the remote controller can control the turning on and off of the lighting apparatus anywhere in a room. Therefore, for remote controllers for these apparatuses, a cone of approximately 90 degrees is required. In other words, it is necessary for the light receiving module to receive both a light signal coming from a direction perpendicular to the shielding surface and a light signal coming substantially from the side of the shielding surface and to detect them at a low S/N (signal to noise) ratio. However, the above-described prior art cannot satisfy such a demand.

SUMMARY OF THE INVENTION

An object of the present invention is to provide a small-size, high-performance light receiving module which hardly picks up noises and has a high response speed.

Another object of the present invention is to provide a light receiving module having an arrangement where input signals are never attenuated and noises are hardly picked up.

Still another object of the present invention is to provide a light receiving module having a wide directional characteristic.

BRIEF DESCRIPTION OF THE DRAWINGS

These and other objects and features of this invention will become clear from the following description taken in conjunction with the preferred embodiments with reference to the accompanied drawings in which.

DESCRIPTION OF THE PREFERRED EMBODIMENTS

Figure 2:
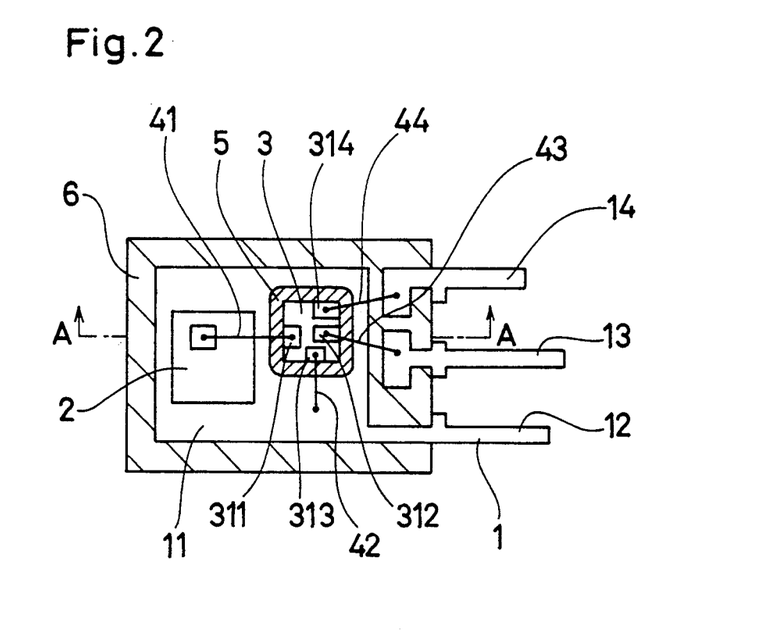
FIG. 2 is a cross-sectional plan view of a light receiving module which is a first embodiment of the present invention.
Figure 3:
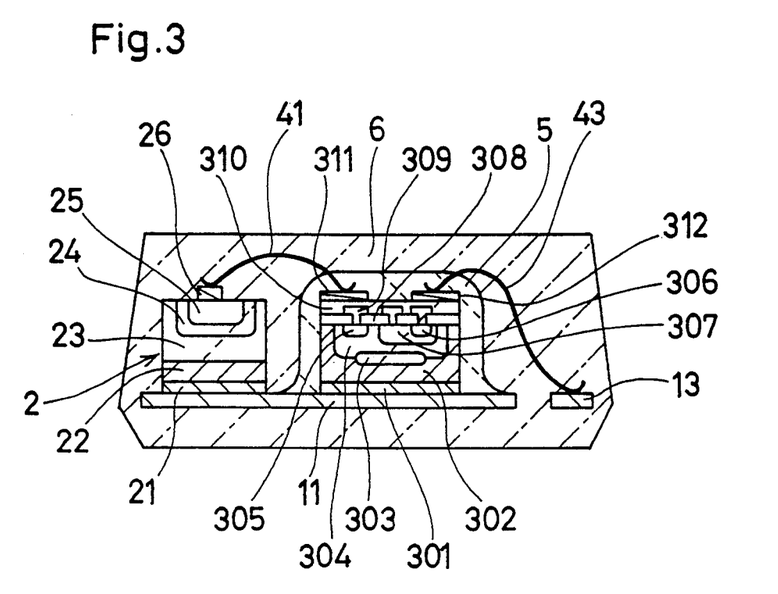
FIG. 3 is a cross-sectional view taken on the line A—A of FIG. 2.
Figure 4:
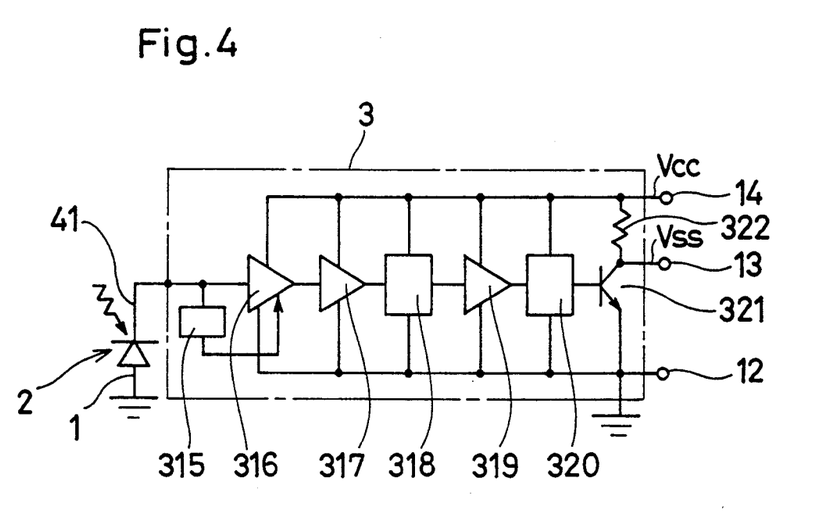
FIG. 4 is a block circuit diagram of the light receiving module which is the first embodiment of the present invention.

The present invention will hereinafter be described with reference to the drawings. FIGS. 2 to 4 show a first embodiment of the present invention. FIG. 2 is a cross-sectional plan view of a light receiving module. FIG. 3 is a cross-sectional view taken on the line A—A of FIG. 2. In the figures, a frame 1, which is made of a metallic plate, has a device fixing portion 11 and a lead portion 12. The device fixing portion 11 has a wide area. Lead frames 13 and 14 are arranged substantially in parallel with the lead portion 12. The lead portion 12 and the frames 13 and 14 function as terminals for connection with external apparatuses.

A light receiving device 2, which consists of, for example, a silicon PIN photodiode, is fixed to the device fixing portion 11 of the frame 1 through a conductive adhesive. The light receiving device 2 includes an electrode 21, a semiconductor substrate (P layer) 22, an I-layer (intrinsic layer) 23, a depletion layer 24, a diffusion layer (N layer) 25 and another electrode 26. The I-layer 23 is a layer where a P-type impurity, such as boron, with a density of $10^{12}$ to $10^{13}$ cm$^{-3}$ is added to silicon. In the semiconductor substrate 22 which is diffused in the lower portion of the I-layer 23, an P-type impurity, such as boron, with densities of $10^{19}$ to $10^{20}$ cm$^{-3}$ is added to silicon. In the diffusion layer (N layer) 25 which is partially and selectively diffused in the upper portion of the I-layer 23, an N-type impurity, such as phosphorus, with densities of $10^{19}$ to $10^{20}$ cm$^{-3}$ is added to silicon. The depletion layer 24, which partially extends from the surface of the N layer 25 into the I-layer 23, is a region in which a carrier density is relatively low.

A circuit device 3 is fixed to the device fixing portion 11 through a conductive adhesive. The circuit device 3, as shown in the cross-sectional view, includes an electrode 301, a semiconductor substrate (P layer) 302, an N+ layer (buried layer) 303, an N layer 304, N+ layers 305 and 306, a P layer 307, an SiO$_2$ layer 308, a conductive layer 309, a conductive layer 310 and other electrodes 311, 312, 313 and 314. As described above, the light receiving device 2 and the circuit device 3 include the semiconductor substrates 22 and 302 of the same conductivity type (P type) on the electrodes 21 and 301 connected to the frame 1, respectively.

Metallic fine lines 41, 42, 43 and 44, which are made of a material such as gold, are connected between the electrode 26 of the light receiving device 2 and the electrode 311 of the circuit device 3, between the device fixing portion 11 and the electrode 313, between the lead frame 13 and the electrode 312 and between the lead frame 14 and the electrode 314, respectively. Preferably, shielding resin 5, such as silicone including carbon, is provided so as to cover the periphery of the circuit device 3.

The device fixing portion 11, the light receiving device 2 and the circuit device 3 or the shielding resin 5 of the frame 1 are integrally covered with black resin 6, made of epoxy resin, which lets transmit therethrough a light ray (generally, infrared ray) with a wavelength required for the light receiving device 2 and intercepts a light ray (especially, a visible ray) with another wavelength.

Subsequently, an operation of the light receiving module will be described with reference to the block diagram of FIG. 4. In the figure, the circuit device 3 includes, for example, an ABLC (auto bias logic level control) circuit 315, an amplifier 316, a limiter 317, a filter 318, a detecting circuit 319, a wave form shaping circuit 320, an output transistor 321 and a resistor 322. The anode (electrode 21) of the light receiving device 2 is connected to a ground potential as an anode common type, while the cathode (electrode 26) thereof is connected to an input terminal 311 of the circuit device 3 through the metallic fine line 41. The ABLC circuit 315 provides a constant reverse bias potential to the light receiving device 2. A direct current voltage Vcc applied to the lead frame 14 provides an operation voltage to each circuit included by the circuit device 3. The lead portion 12 is connected to the ground potential which is one of the power supply potentials.

When a light signal transmitted from a remote controller is received by the light receiving device 2, the light receiving device 2 generates an electric signal in accordance with the amount of irradiated light. After processed (for example, amplified) by the circuit device 3, the electric signal is output to the lead frame 13 as an output signal Vss.

In FIGS. 2 and 3, members (315 to 322) constituting the circuit device 3 which members are shown in FIG. 4 are not shown, and only a characteristic arrangement thereof is shown. The characteristic arrangement is: that the circuit device 3 is connected to the device fixing portion 11 through the electrode 301; that the conductive type of the semiconductor substrate 302 arranged on the electrode 301 is the same (P type) as that of the semiconductor substrate 22 of the light receiving device 2; and that the output electrode 26 of the light receiving device 2 and the input electrode 311 of the circuit device 3 are directly connected to each other through the metallic fine line 41. The members 315 to 322 shown in FIG. 4 are formed on the semiconductor substrate 302.

Figure 5:
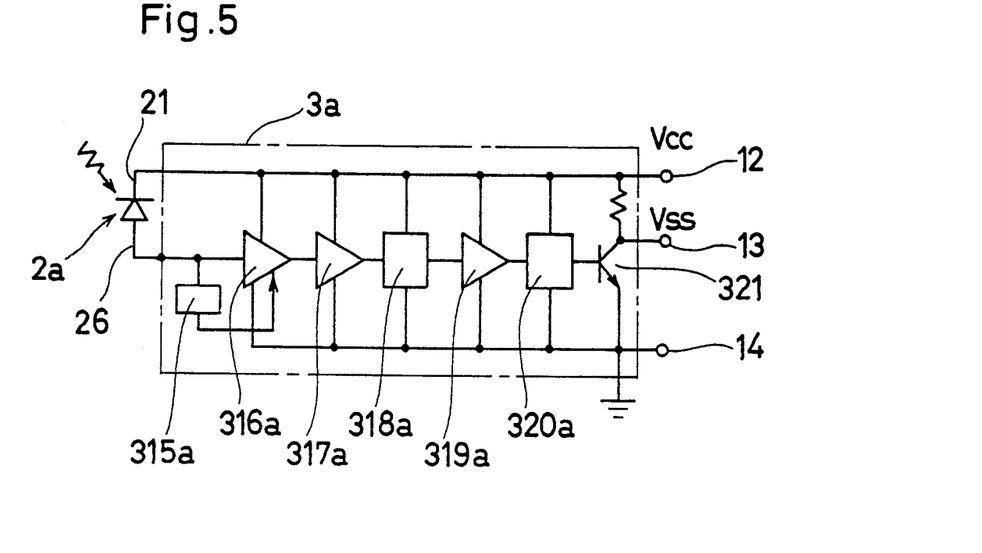
FIG. 5 is a block circuit diagram of a light receiving module which is a second embodiment of the present invention.

Subsequently, as a cathode common type, a second embodiment of the present invention will be described with reference to FIG. 5. In FIG. 5, portions the same as those of the first embodiment are provided with the same reference designations. Moreover, the reference designations of portions corresponding to those of the first embodiment are provided with an affix a. In a light receiving device 2a, the positions of the P and N layers are reverse to those of the light receiving device 2 of the first embodiment. That is, in an I-layer 23a of the light receiving device 2a, an N-type impurity such as phosphorus is added to silicon; in a semiconductor substrate 22a, an N-type impurity such as phosphorus is added to silicon; and in a diffusion layer (P layer) 25a, a P-type impurity such as boron is added to silicon.

In a circuit device 3a, the positions of the P and N layers are reverse to those of the circuit device 3 of the first embodiment. A semiconductor substrate 302a is of N type. As the transistor 321, an NPN-type transistor is used similarly to the first embodiment. The cathode (electrode 21) of the light receiving device 2a is connected to a plus potential through the frame 1 as a cathode common type, while the anode thereof (electrode 26) is connected directly to an input of the circuit device 3a. A power supply potential Vcc applied to the lead portion 12 provides an operation voltage thereof to each circuit included by the circuit device 3a. The lead frame 14 is connected to an earth potential. The output signal Vss is taken out from the lead frame 13.

Figure 6:
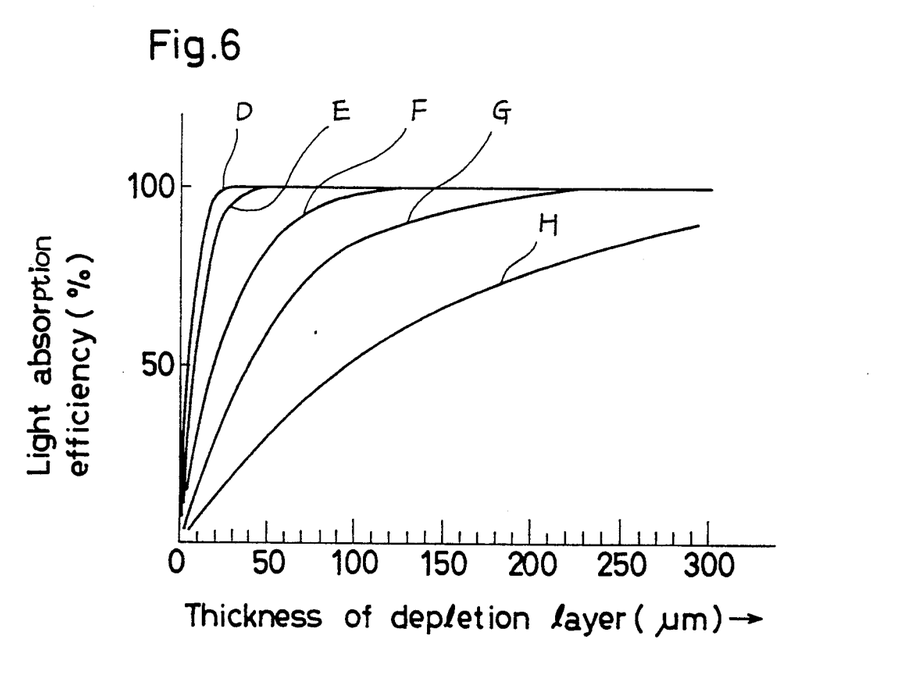
FIG. 6 graphically shows light absorbance efficiency characteristics of the light receiving module which is the second embodiment of the present invention.

FIG. 6 shows light absorption efficiency characteristics of the light receiving device 2a used for the light receiving module which is the second embodiment. In the figure, the horizontal line represents a thickness ($\mu$m) of a depletion layer 24a, while the vertical line represents light absorption efficiency (%), that is, (generated photon number)/(incident photon number)$\times 100$. Characteristics D, E, F, G and H, which are characteristics according to wavelengths of light received by the light receiving device 2a, are those in 700 nm, 780 nm, 900 nm, 940 nm and 1000 nm, respectively.

From the figure, it is understood that it is required that the thickness of the depletion layer be 110 $\mu$m or more in order to effectively (at least 90%) receive infrared rays (930 nm to 950 nm).

If a light receiving device and a circuit device are manufactured integrated on a semiconductor substrate as described in the above description of the prior art, since an I-layer of the light receiving device is manufactured by an epitaxial method, the impurity density of the I-layer is not sufficiently small ($10^{15}$ to $10^{16}$ cm$^{-3}$). Consequently, the resistivity of the I-layer is small, so that it is impossible to increase the thickness of the depletion layer. On the contrary, according to this embodiment, since the light receiving device 2a is manufactured separately from the circuit device 3a, the impurity density of the I-layer 23a of the light receiving device 2a can be set to a small value of $10^{12}$ to $10^{13}$ cm$^{-3}$. Consequently, the resistivity of the I-layer 23a is large (500 $\Omega$cm to 3000 $\Omega$cm), so that the thickness of the depletion layer can be increased to, for example, at least 110 $\mu$m. Consequently, it is possible to effectively (at least 90%) receive infrared rays. Thereby, the sensitivity of the light receiving device 2a improves to increase a response speed thereof. This applies to the first embodiment of FIGS. 2 to 4 and subsequently-described embodiments.

As shown in the above first and second embodiments, according to the present invention, a light receiving device and a circuit device which have semiconductor substrates of the same conductivity type are provided on the same frame through electrodes, respectively. Since the potentials of the light receiving device and circuit device are fixed at a constant value, a variation in output caused by floating never occurs. Moreover, since the output electrode of the light receiving device and the input electrode of the circuit device are directly connected through a metallic wire line, portions for handling a weak signal are sufficiently close to each other, thereby reducing a relevant area. Consequently, an excellent noise-proof characteristic is provided. Moreover, since the light receiving device and the circuit device are directly provided on the frame without using a printed circuit board, the module is compact in size.

Moreover, since light is intercepted by covering the periphery of the circuit device with shielding resin, the circuit device never erroneously operates due to light energy. Further, since the light receiving device is covered with light transmitting resin, appropriate light is directed to the light receiving device.

Figure 7:
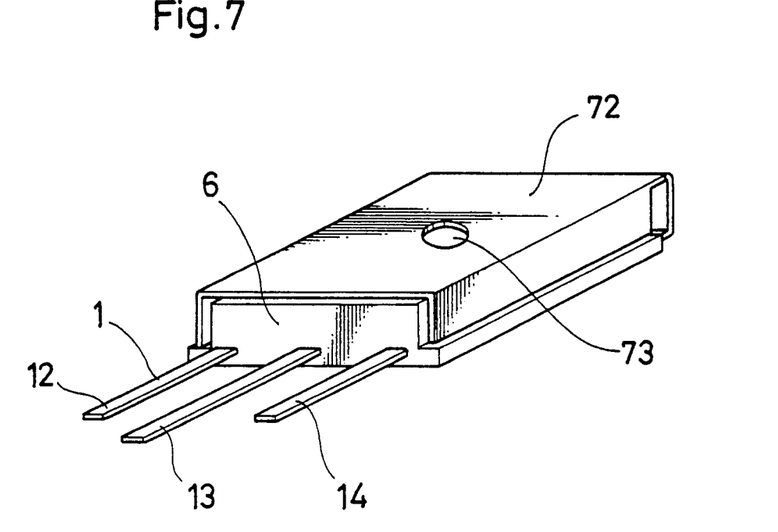
FIG. 7 is an appearance perspective view of a light receiving module which is a third embodiment of the present invention.

Subsequently, a third embodiment of the present invention will be described with reference to FIG. 7. The third embodiment has an advantage in reducing the influence of noise compared with the above-described first and second embodiments. In the third embodiment, a shielding case is provided on the periphery of a light receiving module. In FIG. 7, portions the same as those of the first and second embodiments are provided with the same reference designations. In this embodiment, a plate 72 is provided on an extension of the device fixing portion 11 of the frame 1 of FIG. 2, and is bent into a U-shaped form. That is, a transmission hole 73 is provided to a plate 72 provided on an end portion of the frame 1, and the surface of resin 6 is covered with the plate 72 which is bent and processed so that the transmission hole 73 corresponds to the position of the light receiving device 2 or 2a and main surfaces of the device fixing portion 11 and plate 72 are substantially in parallel with each other. The transmission hole 73 is a hole through which light is directed to the light receiving device 2 or 2a. The light receiving device 2 or 2a and the circuit device 3 or 3a can be covered with at least three surfaces of the frame 1 (with five surfaces in the example of the figure). If the plate is processed into a box shape, it is possible to cover them with six surfaces. Moreover, in a case where the frame 1 is thin or in a case where the frame 1 is slightly returned even though it is bent to increase the distance with the resin 6, the frame 1 can be formed into a predetermined box shape by providing a small protrusion on the side of the resin 6 and providing a hole or a claw on a bent portion of the side of the plate 72 to cause them to engage with each other.

According to this embodiment, a shielding effect is readily and securely obtained by covering the resin 6 with the plate 72 of the frame 1. In that case, light is directed to the light receiving device through the transmission hole 73; however, since the circuit device is shielded from the light by the frame, the circuit device never erroneously operates due to light energy.

The shielding case can be formed on the periphery of the light receiving device by another method. That is, the entire resin of the light receiving module where the lead portion 12 protrudes from the resin 6 is covered with a conductive heat contraction tube, and the tube is brought electrically in contact with the lead portion 12 of the frame 1. In that case, the tube functions as a shielding member since its potential is maintained at a predetermined value via the lead portion 12 of the frame 1. While a PIN photodiode is shown as an example of the light receiving devices 2 and 2a in the above description, it may be applied to a phototransistor and a photodiode.

Subsequently, a fourth embodiment of the present invention will be described with reference to FIGS. 8 and 9. The fourth embodiment is intended to further reduce the influence by noises compared to the above-described first to third embodiments.

Figure 8:
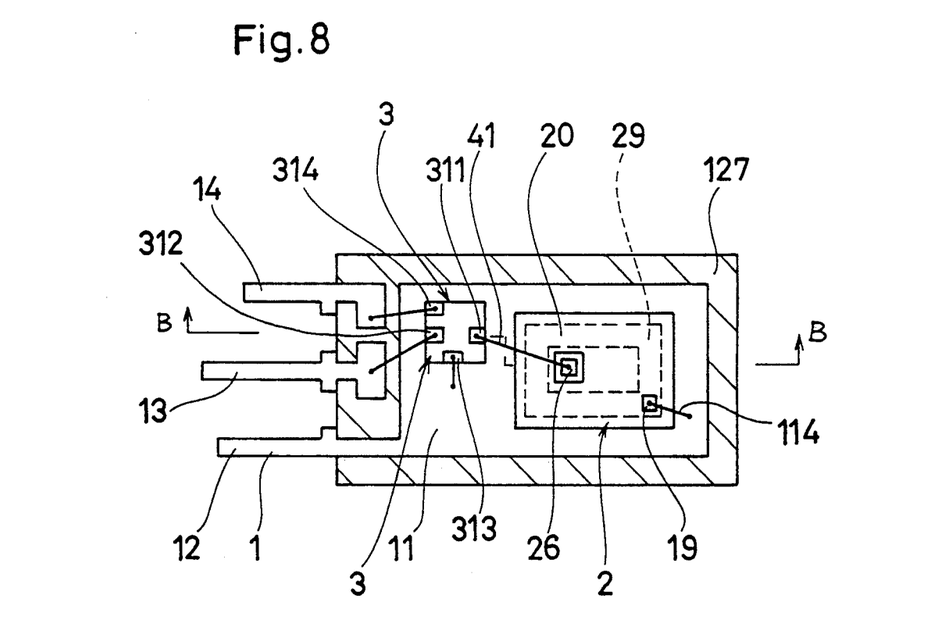
FIG. 8 is a cross-sectional plan view of a light receiving module which is a fourth embodiment of the present invention.
Figure 9:
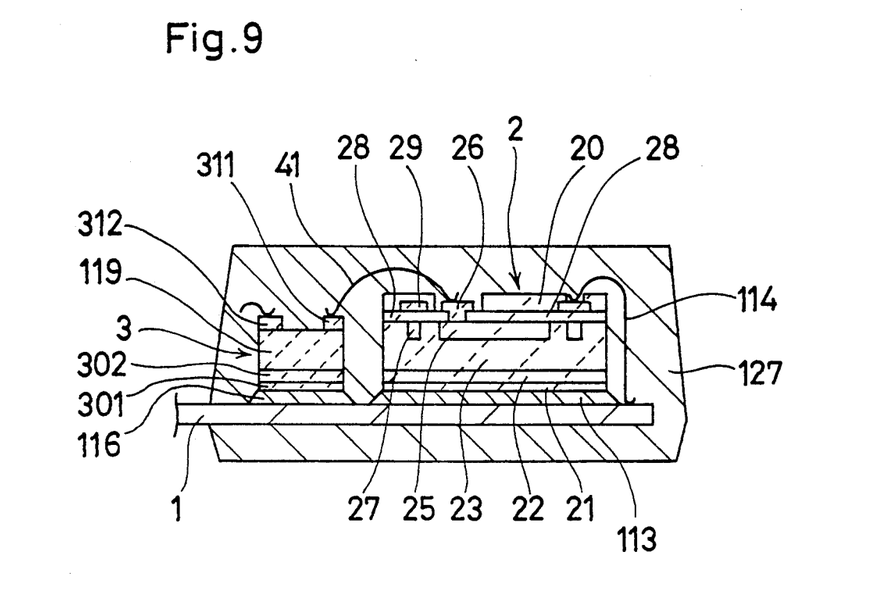
FIG. 9 is a cross-sectional view taken on the B—B line of FIG. 8.

FIG. 8 is a cross-sectional plan view of a light receiving module which is the fourth embodiment of the present invention. FIG. 9 is a cross-sectional longitudinal view thereof.

In these figures, a light receiving device 2 comprises, for example, a silicon PIN photodiode, and a semiconductor substrate 22 is formed on a reverse surface electrode 21. The semiconductor substrate 22 is a P-type substrate, where boron is diffused to silicon, with an impurity density of approximately $1 \times 10^{20}$ cm$^{-3}$ and with a thickness of approximately 5 μm. An I-layer 23 is formed on the semiconductor substrate 22. Its impurity density is approximately $4 \times 10^{12}$ cm$^{-3}$ or less. A diffusion layer 25 is formed by selectively diffusing silicone, to which an N-type impurity such as phosphorus is added, substantially in the center of the surface of the I-layer 23. Its impurity density is approximately $1 \times 10^{20}$ cm$^{-3}$, and its depth is 1 μm to 2 μm. A high-density layer 27, where a P-type impurity such as boron is added to silicon, is formed in the vicinity of the diffusion layer 25 at a distance from the diffusion layer 25. Its impurity density is approximately $1 \times 10^{20}$ cm$^{-3}$, and its depth is 2 to 4 μm.

A surface electrode 26 is formed on a part of the diffusion layer 25 in contact with the diffusion layer 25, and a metal such as aluminum is evaporated thereto. An insulating film 28, which is made of silicon oxide (SiO$_2$), is formed on a portion of the surface of the I-layer 23 except for a position of the surface electrode 26. It is provided to protect the surface. A surrounding electrode 29 is formed on an insulating film 28 located above the high-density layer 27, and the width thereof is slightly larger than that of the high-density layer 27. It is formed by evaporating a metal such as aluminum. A transparent conductive film 20 is formed on a portion of the surface of the insulating film 28 except for a position of the surface electrode 26 and on the surrounding electrode 29. Indium tin oxide (ITO) is evaporated thereto by a sputter method or by an electron beam method. A bonding pad 19 is provided by removing a part of the transparent conductive film 20 so that a part of the surrounding electrode 29 is exposed.

A first frame 1, which is made of a metallic plate, is provided with the light receiving device 2 through a conductive adhesive 113. A fine metallic line 114, which is made of a material such as gold, is connected to the bonding pad 19 and to the first frame 1 so that the transparent conductive film 20 and the semiconductor substrate 22 are electrically connected.

A circuit device 3 is provided on the first frame 1 through the conductive adhesive 116. The circuit device 3 includes a reverse surface electrode 301, a P-type semiconductor substrate 302, a compound layer 119 and surface electrodes 311, 312, 313 and 314. A fine metallic line 41, which is made of a material such as gold, connects the surface electrode 311 of the circuit device 3 to the surface electrode 26 of the light receiving device 2. A second frame 13 and a third frame 14, which are made of metallic plates, are connected to the surface electrodes 312 and 314, respectively. Resin 127, which is made of epoxy resin, is provided to cover the light receiving device 2, the circuit device 3 and the first, second and third frames 1, 13 and 14. Moreover, in accordance with a sensitivity characteristic of the light receiving device 2, a filter dye which attenuates visible rays but through which infrared rays pass is mixed in the resin 127 at need. These members constitute a light receiving module.

The circuit arrangement of the fourth embodiment is the same as that of the first embodiment shown in FIG. 4.

As shown in the fourth embodiment, by covering substantially the entire surface of the light receiving device with the transparent conductive film and by electrically connecting the semiconductor substrate which is the rear surface of the light receiving device and the transparent conductive surface, the entire periphery of the light receiving device is of the substantially same potential. Therefore, the light receiving device placed in an electromagnetic field produced by a fly-back transformer of a television receiver is shielded from electromagnetism with the protecting surface of the same potential. Moreover, since the transparent conductive film has a transmission factor of 80% or more within a visible ray or an infrared ray regions, an input light signal hardly attenuates and is hardly influenced by noises.

Moreover, in the module, since the light receiving device itself has a shielding capability against electromagnetism, a shielding case where a mesh structure is provided outside of the light receiving device and a filter, like the ones provided to the conventional light receiving module shown in FIG. 1, are not required. Thereby, the arrangement is simplified, which reduces the size and cost of the apparatus.

Further, an overflowing current flowing between the diffusion layer and the insulting film is blocked by the high-density layer formed in the periphery of the diffusion layer. Moreover, since incident light never strikes on the high-density layer due to the blocking by the surrounding electrode located above the high-density layer, no undesirable current is generated in the periphery of the high-density layer. For this reason, a predetermined output current is obtained, and a predetermined diode characteristic (an output current with respect to a bias voltage applied) is obtained.

Moreover, since the fine metallic line is directly connected to the surrounding electrode by providing the bonding pad on a part of the transparent conductive film, and since the base is constructed to be firm, an excellent bonding operation capability is obtained.

Figure 10:
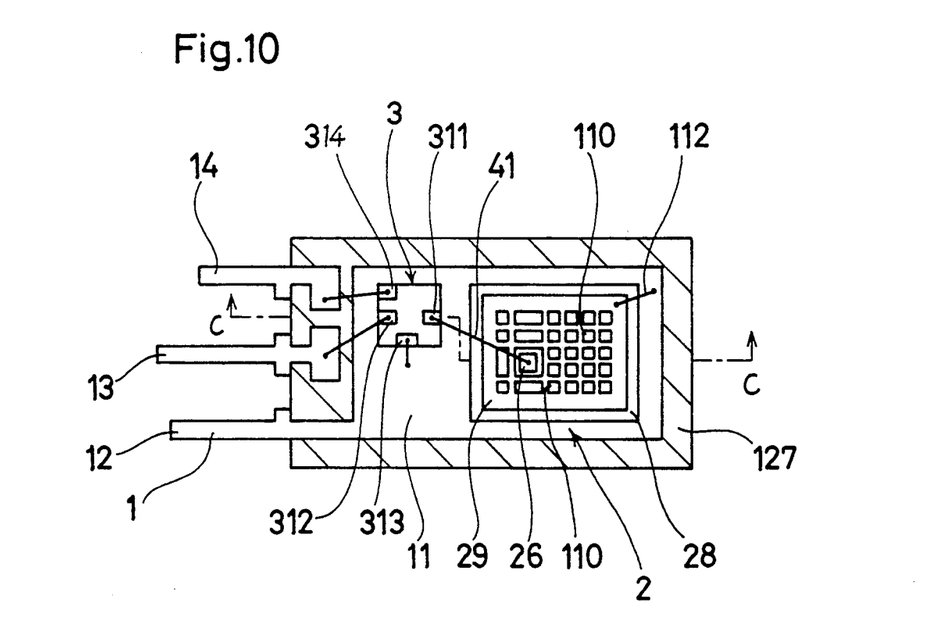
FIG. 10 is a cross-sectional plan view of a light receiving module which is a fifth embodiment of the present invention.
Figure 11:
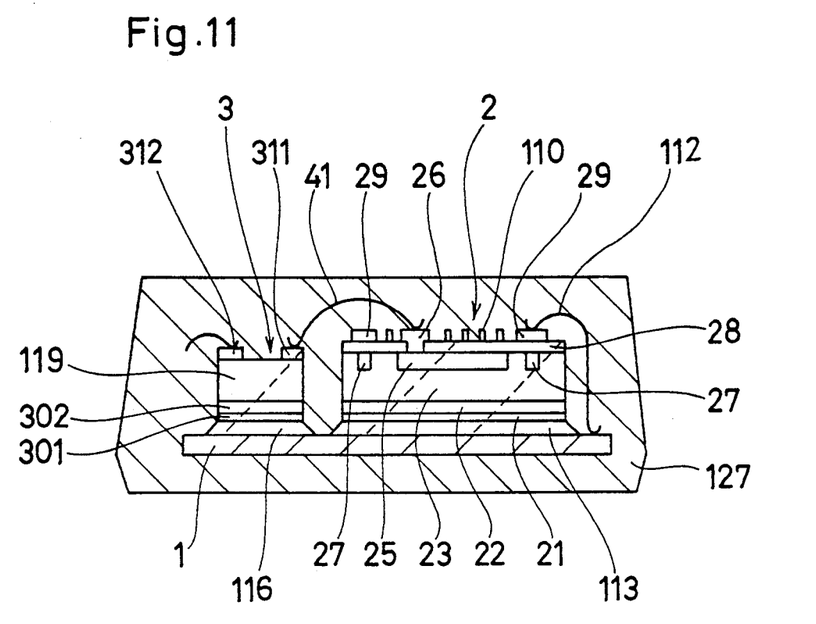
FIG. 11 is a cross-sectional view taken on the line C—C of FIG. 10.

FIGS. 10 and 11 show a fifth embodiment of the present invention. The fifth embodiment has an advantage in manufacturing the light receiving module since the forming steps thereof can be simplified compared with the above-mentioned fourth embodiment. FIG. 10 is a cross-sectional plan view of a light receiving module. FIG. 11 is a cross-sectional view taken on the A—A line of FIG. 10. In these figures, members the same as those of the fourth embodiment of FIGS. 8 and 9 are identified by the same reference designations, and a description thereof will be omitted.

In FIGS. 10 and 11, a mesh electrode 110 is formed on a portion of the surface of an insulating film 28 except for a position of a surface electrode 26 of the light receiving device 2 so to be electrically connected to a surrounding electrode 29. The mesh electrode 110 is formed by evaporating a metal such as aluminum. Its longitudinal and lateral pitches are approximately 400 μm. Its line width is approximately 5 μm. Its thickness is approximately 2 μm. The mesh electrode 110 is formed simultaneously with the surrounding electrode 29. A metallic fine line 112, which is made of a material such as gold, is coupled to the surrounding electrode 29 and a first frame 1 so that the mesh electrode 110 is electrically connected to a semiconductor substrate 22.

As described above, according to this embodiment, since the surface of the light receiving device is covered with the mesh electrode and the surrounding electrode and since the semiconductor substrate which serves as the rear surface of the light receiving device and the surrounding electrode are electrically connected, the entire periphery of the light receiving device is provided with the substantially same potential. Consequently, the light receiving device placed in an electromagnetic field produced by a flyback transformer of a television receiver is shielded from electromagnetism with the protecting surface of the same potential. Moreover, since the mesh electrode has an numerical aperture of $395/400 = 98.75\%$ and a high transmission factor, an input light signal hardly attenuates and is hardly influenced by noises.

Moreover, since the light receiving device itself has a shielding capability against electromagnetism, a shielding case where a mesh structure is provided outside of the light receiving device and a filter, both of which have conventionally been employed for light receiving modules, are not required. Thereby, the arrangement is simplified, which reduces the size and cost of the apparatus.

Further, since according to the fifth embodiment, the mesh electrode and the surrounding electrode can simultaneously be formed, the number of the manufacturing processes is reduced by one compared to the arrangement of the previously described fourth embodiment, thereby decreasing the cost.

The transparent conductive film 20 is provided in the previously-described fourth embodiment, and the mesh electrode 10 is provided in the fifth embodiment. Both of them are transparent films.

Figure 12:
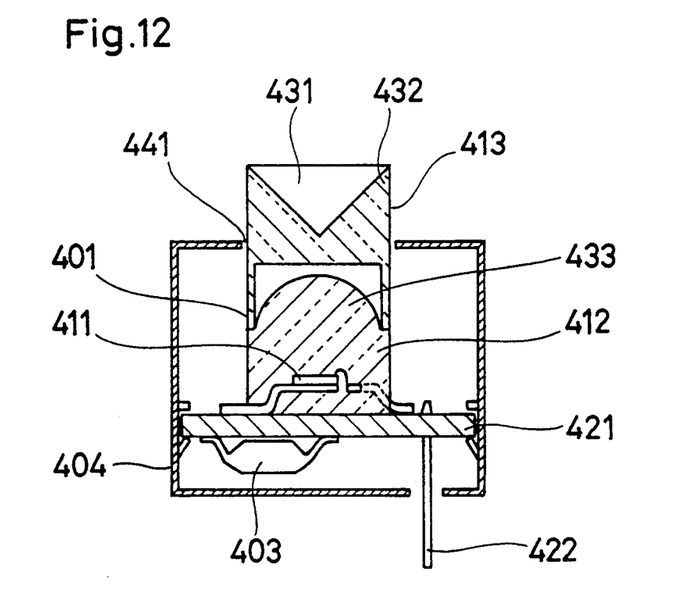
FIG. 12 is a cross-sectional view of a light receiving module which is a sixth embodiment of the present invention.

In a sixth embodiment of the present invention shown in FIG. 12, a wide directional characteristic is provided to a light receiving device.

FIG. 12 is a cross-sectional view of the light receiving module which is the sixth embodiment of the present invention. In the figure, the numeral 401 is a light receiver including a light receiving device 411 such as a phototransistor and a PIN (persistent internal photopolarization) photodiode. The light receiving device 411 is covered with resin 412, and a lens portion 413 having an inverse-cone-shaped concave 431 is provided integrally with the resin 412 on the upper portion of a light receiving surface of the light receiving device 411. Moreover, a filter dye which attenuates visible rays but through which infrared rays pass is mixed in the lens portion 413 in accordance with the sensitivity characteristic of the light receiving device 411.

The light receiver 401 is fixed to a printed circuit board 421 or a lead frame, and is connected to a circuit device 403 which detects an output of the light receiving device 411. A circuit device 403 is connected to a terminal 422 through which electric power from the exterior is received and a detection is outputted.

The numeral 404 is a shielding case containing the printed circuit board 421 and the circuit device 403. It is a substantially dice-shaped rectangular solid. A transmission hole 441 is provided on one surface thereof. Concerning the light receiver 401, the lens portion 413 thereof is projected from the shielding case 404, and a portion, of resin 412, where the light receiving device 411 is provided is contained by the shielding case 404.

Figure 13:
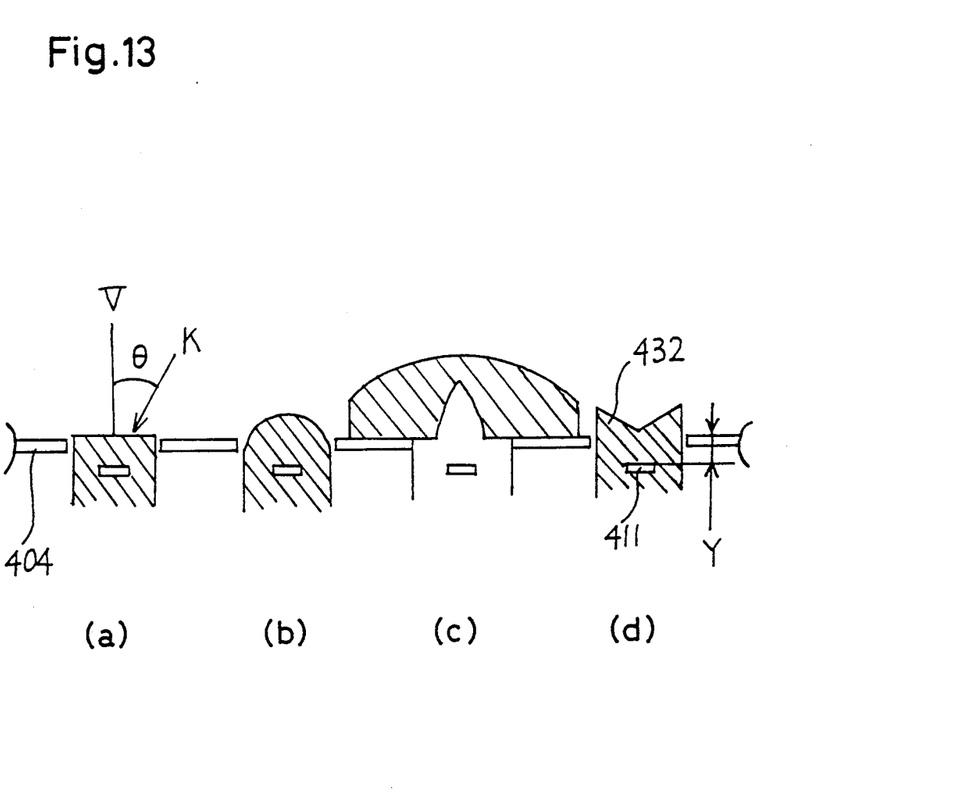
FIG. 13 is an explanatory view of the sixth embodiment of the present invention.
Figure 14:
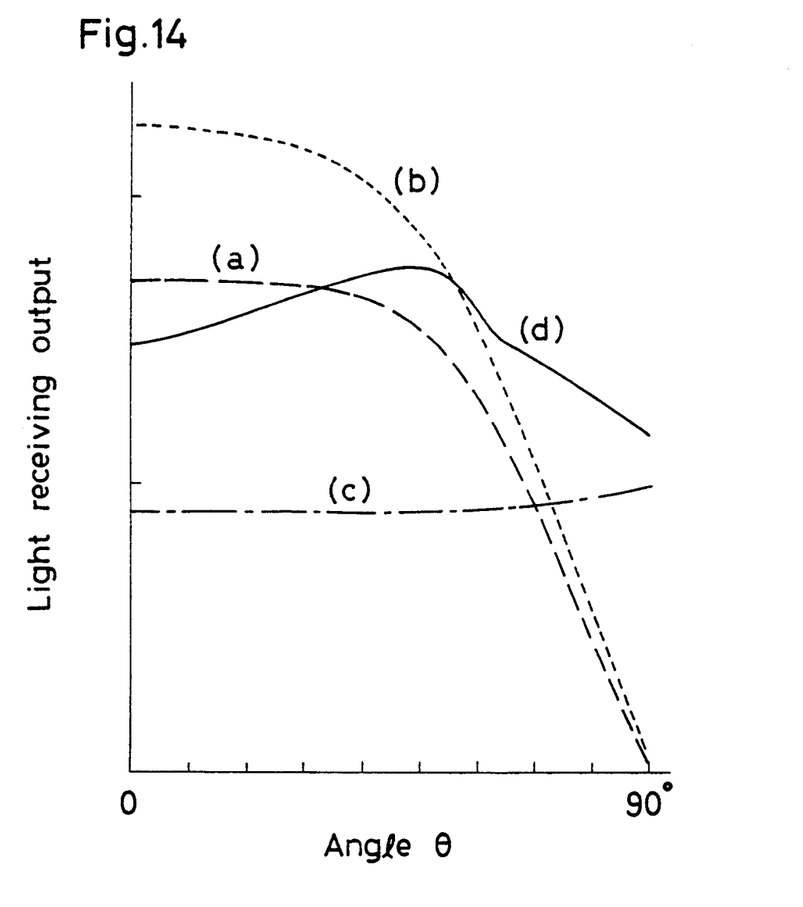
FIG. 14 shows directional sensitivity characteristics of the light receiving module which is the sixth embodiment of the present invention.

In such an arrangement, it is easily understood that a light signal coming from a wide range can be received since the lens portion arranged on the upper portion of the light receiving surface of the light receiving device 411 is projected from the shielding case 404. The reception range, however, differs depending on the configuration of the lens. Concerning (a) of FIG. 13, consider a line K which is at an angle $\theta$ to a perpendicular V with respect to a flat portion of the shielding case 404 and assume that a light signal generator is arranged in a cone which is a cone-shaped range formed by rotating the line K about the perpendicular V. The cone indicates a directivity range. In order to examine a size of the cone where an effective reception sensitivity can be obtained, FIG. 14 shows characteristics of the angle $\theta$ and light reception output with respect to the four lens configurations shown in FIG. 13. Although not shown, concerning two lens configurations (a) and (b) having a high S/N ratio against a light noise, reception outputs in a lateral direction ($\theta > 60$ degrees) are low. Concerning a lens configuration (c) where a circular lens is completely projected from the shielding case, it is shown that it has a large cone with a large reception output. The level, however, is low, and the S/N ratio is undesirable.

Concerning a lens configuration (d) of this embodiment, it has a reception output and an S/N ratio of a comparatively high level. Since an output level is high when the angle $\theta$ of the cone is in the vicinity of 60 degrees, the configuration (d) copes with an angle at a position most frequently used in a remote control system having a remote control adapter fixed on the ceiling. Thus, it is most suitable for the this type of remote control system. Concerning the lens portion 413 having the inverse-cone-shaped portion 432, the position of the light receiving device 411, that is, a distance Y from the flat portion of the shielding case 404 to the light receiving device 411 relates to the S/N ratio. In a case where the light receiving device is covered with a shielding case, the distance Y is approximately half the ratio of the size of the light receiving device 411 to the size of the transmission hole 441. For example, when the transmission hole 441 is 5 mm and one of the sides of the light receiving device 411 is 2 mm, the distance Y is 1.25 mm or more. Specifically, in a case where a light emitting device and a light receiving device were arranged at the center of the cone (that is, on the perpendicular A) and the lens portion of the light receiver was projected from the shielding case and the light receiving device arranged at a distance of 1.5 mm was contained by the shielding case together with a circuit device, when a visible ray neon tube was arranged within the cone at a distance with respect to which a remote control signal can be detected with no error, a noise figure (S/N) relating to the light noise was 95% of that obtained in a case where no light signal error is caused. When a flyback transformer is arranged instead of the neon tube, a noise figure thereof was 50% to 65%. When the distance Y is 2.0 mm, a high S/R ratio which was substantially similar to those obtained in the above case was maintained. If the distance Y is small and the circuit device 403 is provided outside the shielding case 404, the electromagnetic noise is easily influenced although the light noise is hardly influenced. For example, although the S/N rate is 20% when the distance Y is 0.5 mm, the S/N rate is remarkably reduced to 10% when the distance Y is 0 mm (on the plain surface of the shielding case).

It is desirable that the angle of the inverse-cone-shaped portion 432 is equal to or larger than a critical angle at which light incident from the side of the shielding surface is totally reflected. Moreover, it is preferable to provide a convex lens 433 between the inverse-cone-shaped opening 431 and the light receiving device 411 since the light receiving output is further increased in the vicinity of the cone angles $\theta$ of 10 to 30 degrees and 75 degrees.

As described above, a light signal which is substantially right-angled to the shielding surface is incident onto the inverse-cone-shaped opening of the lens portion and is directed to the light receiving device, while a light signal coming from the side of the shielding surface is incident onto the lens portion projecting from the shielding case and is reflected by the inverse-cone-shaped portion to be directed to the light receiving device. Since such light is converted to an electric signal within the shielding case and is immediately signal-processed by the circuit device, the S/N ratio is high and further, the cone is provided with a wide directional characteristic of 90 degrees. For this reason, the light signal which is substantially right-angled to the shielding surface and the light signal coming from the side of the shielding surface can be utilized for a remote control receiver for apparatuses attached to the ceiling and large-size apparatuses.

Obviously, many modifications and variations of the present invention are possible in light of the above teachings. It is therefore to be understood that within the scope of the appended claims, the invention may be practiced other than as specifically described.

What is claimed is:

1. A light receiving module comprising:
    a frame including a lead portion which is connected to a power source potential;
    a light receiving device provided on said frame so that one end of the light receiving device is connected to the frame through an electrode;
    a circuit device provided on said frame so that one end of the circuit device is connected to the frame through an electrode, said circuit device including an amplifier for amplifying an output signal from said light receiving device and said circuit device being directly connected to said light receiving device so as to receive said output signal of said light receiving device,
    wherein said light receiving device and said circuit device respectively have semiconductor substrates of a same conductive type on said electrodes through which said light receiving device and said circuit device are connected to said frame.

2. A light receiving module according to claim 1, wherein a periphery of said circuit device is covered with light shielding resin and wherein said light receiving device and said shielding resin are covered with light transmitting resin.

3. A light receiving module according to claim 1, wherein said light receiving device is made of PIN photodiode and wherein a resistivity of an I-layer thereof is 500 $\Omega$ cm to 3000 $\Omega$cm.

4. A light receiving module according to claim 1, wherein said light receiving device is made of PIN photodiode having a depletion layer which is a region where a carrier density is low and wherein a thickness of said depletion layer thereof is at least 110 $\mu$m.

5. A light receiving module according to claim 1, further comprising resin which covers said light receiving device, said circuit device and a part of said frame, wherein said frame includes a plate having a transmission hole, said plate covering a surface of said resin so that a position of said transmission hole corresponds to a position of said light receiving device.

6. A light receiving module comprising:
    a light receiver provided with a light receiving device and a lens portion which covers said light receiving device and has an inverse-cone-shaped concave on an upper portion of a light receiving surface of said light receiving device; and
    a shielding case from which said lens portion of said light receiver protrudes and said shielding case contains a) a portion where said light receiving device is provided and b) a circuit device which processes an output of said light receiving device.

7. A light receiving module comprising:
    a frame which is connected to a power source potential;
    a light receiving device provided on said frame, said light receiving device including
        a reverse surface electrode connected to said frame,
        a semiconductor substrate provided on said reverse surface electrode,
        an I-layer formed on said semiconductor substrate,
        a diffusion layer formed substantially in a center in a surface of said I-layer,
        a surface electrode formed so as to be in contact with said diffusion layer,
        a high-density layer located in a periphery of said diffusion layer and formed in the surface of said I-layer,
        an insulating film formed on a portion of the surface of said I-layer except for a position of said surface electrode,
        a surrounding electrode formed on a portion of said insulating layer which portion corresponds to said high-density layer,
        a transparent film formed on a portion of a surface of said insulating film except for a position of said surface electrode so as to be electrically connected to said surrounding electrode; and
        connecting means for electrically connecting said transparent film and said semiconductor substrate;
    a circuit device provided on said frame and including a reverse surface electrode connected to said frame and a surface electrode connected to said surface electrode of said light receiving device.

8. A light receiving module according to claim 7, wherein said transparent film is a transparent conductive film which is formed also on said surrounding electrode.

9. A light receiving module according to claim 7, wherein said connecting means includes a metallic fine line for connecting said transparent film and said frame.

10. A light receiving module according to claim 7, wherein said transparent film is made of a metal and formed in a mesh configuration.

* * * * *